(12) United States Patent
Jomaa et al.

(10) Patent No.: US 7,638,877 B2
(45) Date of Patent: Dec. 29, 2009

(54) ALTERNATIVE TO DESMEAR FOR BUILD-UP ROUGHENING AND COPPER ADHESION PROMOTION

(75) Inventors: Houssam Jomaa, Chandler, AZ (US); Christine Tsau, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 353 days.

(21) Appl. No.: 11/479,101

(22) Filed: Jun. 30, 2006

(65) Prior Publication Data

US 2008/0001267 A1    Jan. 3, 2008

(51) Int. Cl.
  *H01L 23/48* (2006.01)
(52) U.S. Cl. .......... 257/750; 257/753; 257/762; 257/773; 257/711; 257/775; 257/E23.106; 257/E23.16
(58) Field of Classification Search ............ 257/685, 257/723, 777, E25.006, E25.013, E25.018, 257/E25.021, E25.027, E23.085, E21.614, 257/750, 753, 762, 792, E23.062, E23.063, 257/E23.106, E23.16, E23.161

See application file for complete search history.

(56) References Cited

U.S. PATENT DOCUMENTS 7,081,674 B2 *   7/2006  Ganapathiraman et al. .. 257/751

OTHER PUBLICATIONS

"pH-Gated Porosity Transitions of Polyelectrolyte Multilayers in Confined Geometries and Their Application as Tunable Bragg Reflectors", Lei Zhai et al., pp. 6113-6123, vol. 37. No. 16, 2004.*
"Ink-Jet Printing, Self_Assembled Polyelectrolytes, and Electroless Plating: Low Cosr Frabrication of Circuits on a Flexible at Room Temperature.", Kevin Cheng et al., pp. 247-250, 2004.*
U.S. Appl. No. 11/441,841, filed May 6, 2006, Nalla, et al.
Mendelsohn, J.D., et al., "Fabrication of Microporous Thin Films from Polyelectrolyte Multilayers", *Langmuir* 16:5017-5023, (2000).

* cited by examiner

*Primary Examiner*—Jasmine J Clark
(74) *Attorney, Agent, or Firm*—David L. Guglielmi

(57) ABSTRACT

In some embodiments, an alternative to desmear for build-up roughening and copper adhesion promotion is presented. In this regard, a substrate in introduced having a dielectric layer, a plurality of polyelectrolyte multilayers on the dielectric layer, and a copper plating layer on the polyelectrolyte multilayers. Other embodiments are also disclosed and claimed.

15 Claims, 2 Drawing Sheets

ALTERNATIVE TO DESMEAR FOR BUILD-UP ROUGHENING AND COPPER ADHESION PROMOTION

FIELD OF THE INVENTION

Embodiments of the present invention generally relate to the field of integrated circuit packages, and, more particularly to an alternative to desmear for build-up roughening and copper adhesion promotion.

BACKGROUND OF THE INVENTION

The demand for enhanced performance and functionality of integrated circuit components continues to increase design and fabrication complexity. The substrates designed for these components will need to be manufactured with multiple layers of copper on dielectric material. One method commonly used to promote adhesion of copper to dielectric build-up material is desmear. Desmear typically involves treating an organic substrate surface with a sweller, an acid such as permanganic acid to promote microroughness, and a neutralizer. However, some issues with desmear include process control and reproducibility, throughput time, and potential environmental concerns.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
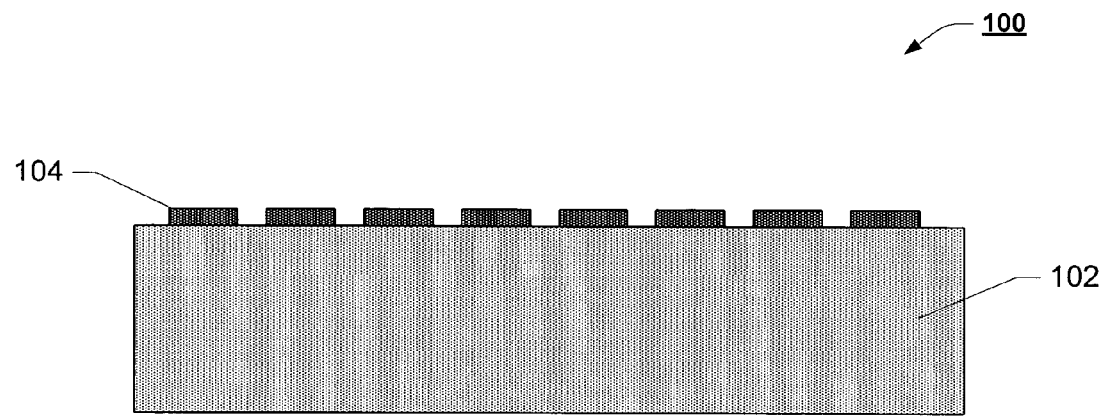
FIG. 1 is a graphical illustration of a cross-sectional view of a partially formed IC package substrate, in accordance with one example embodiment of the invention.

FIG. 1 is a graphical illustration of a cross-sectional view of a partially formed IC package substrate, in accordance with one example embodiment of the invention. In accordance with the illustrated example embodiment, package substrate 100 includes one or more of substrate core 102 and copper conductors 104.

Substrate core 102 represents a substrate core that may comprise multiple conductive layers laminated together. Substrate core 102 may be laminated with dielectric material as part of a substrate build-up and may have insulated traces and vias routed through it.

Copper conductors 104 are intended to represent conductive traces patterned onto substrate core 102.

Figure 2:
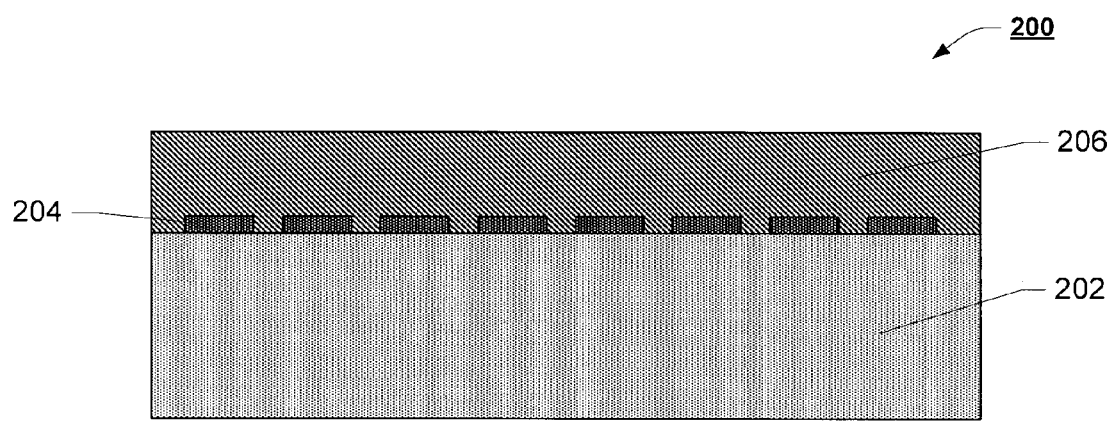
FIG. 2 is a graphical illustration of a cross-sectional view of a partially formed IC package substrate, in accordance with one example embodiment of the invention.

FIG. 2 is a graphical illustration of a cross-sectional view of a partially formed IC package substrate, in accordance with one example embodiment of the invention. As shown, package substrate 200 includes one or more of substrate core 202, copper conductors 204 and dielectric material 206.

Dielectric material 206 represents an organic dielectric material, such as epoxy based dielectric, that has been added to substrate core 202 as part of a build-up process. In one embodiment, dielectric material 206 is laminated and cured. In another embodiment, dielectric material 206 is not cured until after further processing.

Figure 3:
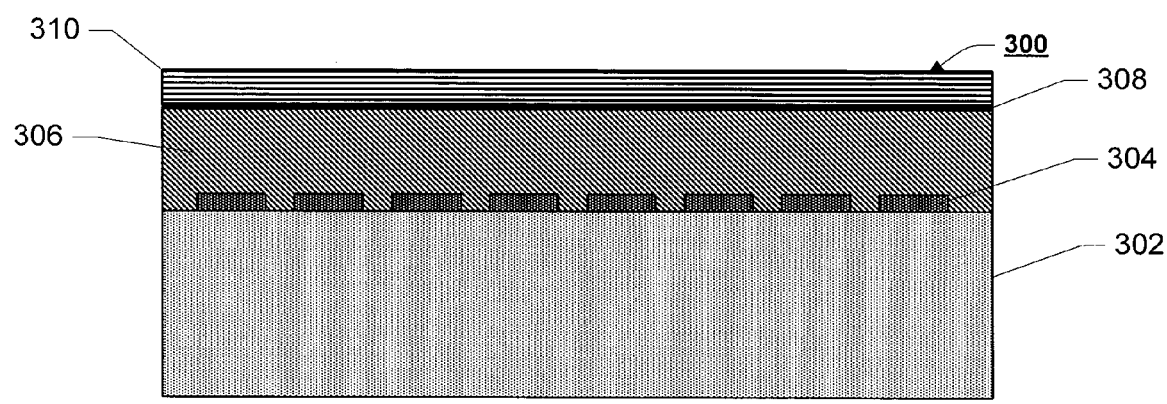
FIG. 3 is a graphical illustration of a cross-sectional view of a partially formed IC package substrate, in accordance with one example embodiment of the invention.

FIG. 3 is a graphical illustration of a cross-sectional view of a partially formed IC package substrate, in accordance with one example embodiment of the invention. As shown, package substrate 300 includes one or more of substrate core 302, copper conductors 304, dielectric material 306, precursor layer 308 and polyelectrolyte multilayers 310.

Precursor layer 308 may be present to promote adhesion between dielectric material 306 and polyelectrolyte multilayers 310. In one embodiment, precursor layer 308 comprises polyacrylic acid-co-polyvinylphenol (PAAcoPVP) that is either sprayed or deposited by dipping on dielectric layer 306. Dielectric material 306 is then cured, causing the hydroxyl groups of the PVP to react with and bond to dielectric material 306. In another embodiment, precursor layer 308 comprises polyacrylic acid (PAA) that is either sprayed or deposited by dipping on dielectric layer 306 at a pH of about 5 after a sweller solution has been applied to the surface of dielectric layer 306. Acid catalyzed esterification is then carried out to replace the hydroxyl groups on the surface by ester bonds with the acrylic acid moieties with a target of partial (about 40%) Fisher esterification.

Polyelectrolyte multilayers 310 represent alternate depositions of oppositely charged polyelectrolytes, such as polyacids and polybases. In one embodiment, the polyelectrolyte multilayers are alternate depositions of polyacrylic acid (PAA) and polyallylamine hydrochloride (PAH). In one embodiment, HCl and NaOH are used to adjust the pH of the deposition of each PAA layer to about 3.5 and each PAH layer to about 7.5. Rinsing by spraying with or dipping in HCl at pH of about 3.5 may occur after deposition of a PAA layer, and in NaOH at pH of about 7.5 after deposition of a PAH layer. In one embodiment, polyelectrolyte multilayers 310 comprises 25 layers with a thickness of about 1.5 microns.

Figure 4:
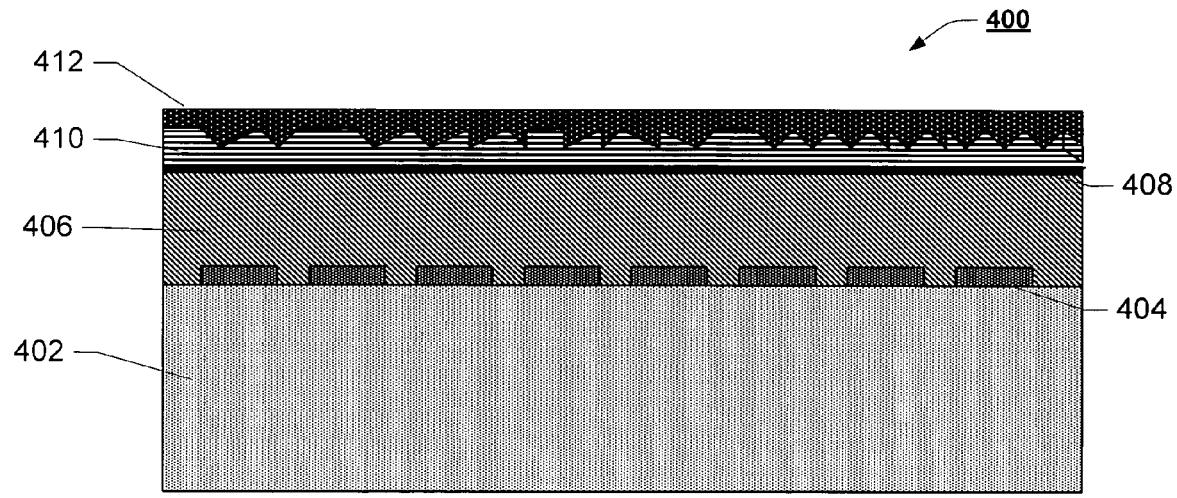
FIG. 4 is a graphical illustration of a cross-sectional view of a partially formed IC package substrate, in accordance with one example embodiment of the invention.

FIG. 4 is a graphical illustration of a cross-sectional view of a partially formed IC package substrate, in accordance with one example embodiment of the invention. As shown, package substrate 400 includes one or more of substrate core 402, copper conductors 404, dielectric material 406, precursor layer 408, polyelectrolyte multilayers 410, and copper plating layer 412.

Copper plating layer 412 represents copper that has adhered to polyelectrolyte multilayers 410 through electro-less plating. In one embodiment, the process of electro-less copper plating includes an acid treatment at a pH of about 2.4 which changes the morphology of polyelectrolyte multilayers 410. In one embodiment, polyelectrolyte multilayers 410 doubles in thickness to about 3 microns and contains micropores about 100 nm in size. One skilled in the art would recognize that a microporous membrane can promote copper adhesion without the need for desmear.

In one embodiment, package substrate 400 is coupled with an integrated circuit die such as a flip chip silicon die. In another embodiment, package substrate 400 is laminated with another dielectric layer as part of a continued build-up process.

Figure 5:
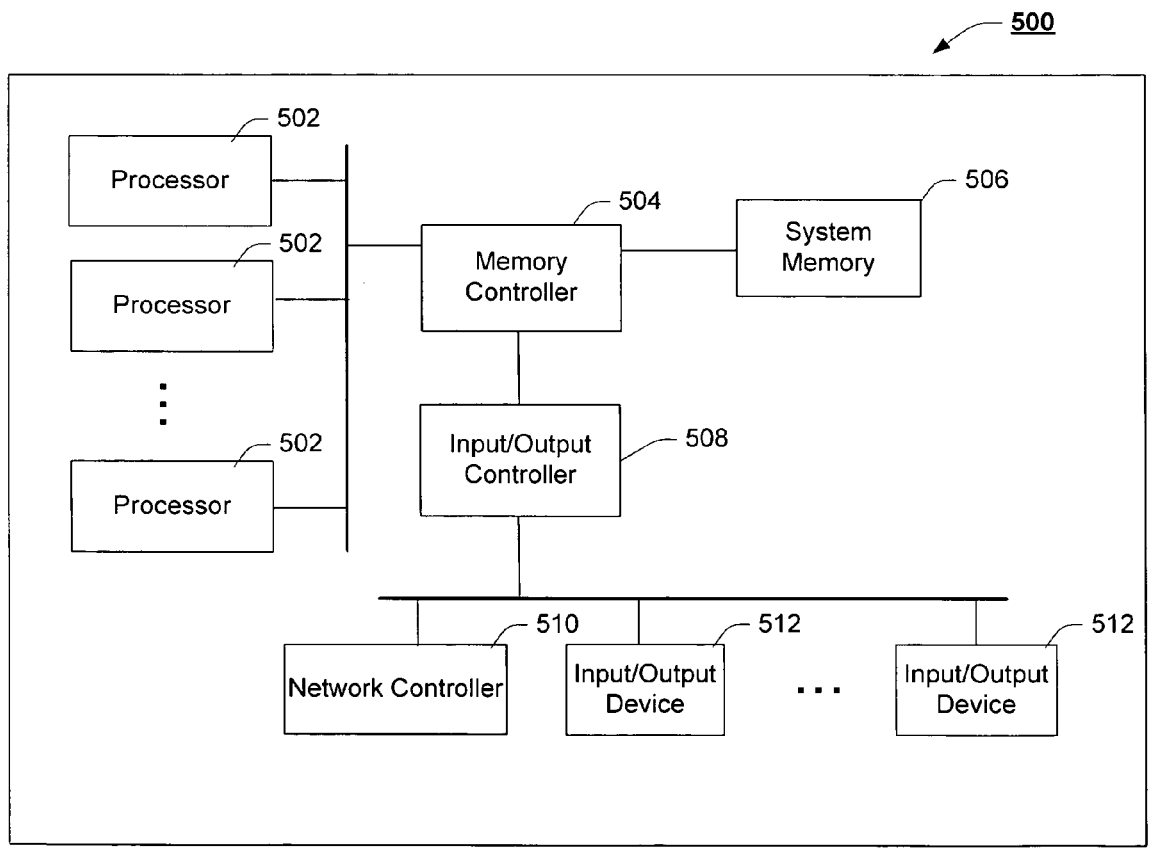
FIG. 5 is a block diagram of an example electronic appliance suitable for implementing an IC package substrate with conductor structure on dielectric material, in accordance with one example embodiment of the invention.

FIG. 5 is a block diagram of an example electronic appliance suitable for implementing an IC package substrate with conductor structure on dielectric material, in accordance with one example embodiment of the invention. Electronic appliance 500 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 500 may include one or more of processor(s) 502, memory controller 504, system memory 506, input/output controller 508, network controller 510, and input/output device(s) 512 coupled as shown in FIG. 5. Processor(s) 502, or other integrated circuit components of electronic appliance 500, may be housed in a package including a substrate described previously as an embodiment of the present invention.

Processor(s) 502 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors(s) 502 are Intel® compatible processors. Processor(s) 502 may have an instruction set containing a plurality of machine level instructions that may be invoked, for example by an application or operating system.

Memory controller 504 may represent any type of chipset or control logic that interfaces system memory 508 with the other components of electronic appliance 500. In one embodiment, the connection between processor(s) 502 and memory controller 504 may be referred to as a front-side bus. In another embodiment, memory controller 504 may be referred to as a north bridge.

System memory 506 may represent any type of memory device(s) used to store data and instructions that may have been or will be used by processor(s) 502. Typically, though the invention is not limited in this respect, system memory 506 will consist of dynamic random access memory (DRAM). In one embodiment, system memory 506 may consist of Rambus DRAM (RDRAM). In another embodiment, system memory 506 may consist of double data rate synchronous DRAM (DDRSDRAM).

Input/output (I/O) controller 508 may represent any type of chipset or control logic that interfaces I/O device(s) 512 with the other components of electronic appliance 500. In one embodiment, I/O controller 508 may be referred to as a south bridge. In another embodiment, I/O controller 508 may comply with the Peripheral Component Interconnect (PCI) Express™ Base Specification, Revision 1.0a, PCI Special Interest Group, released Apr. 15, 2003.

Network controller 510 may represent any type of device that allows electronic appliance 500 to communicate with other electronic appliances or devices. In one embodiment, network controller 510 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 510 may be an Ethernet network interface card.

Input/output (I/O) device(s) 512 may represent any type of device, peripheral or component that provides input to or processes output from electronic appliance 500.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An integrated circuit chip package substrate comprising:
   a dielectric layer;
   a precursor layer on the dielectric layer;
   a plurality of polyelectrolyte multilayers on the precursor layer; and
   a copper plating layer adhered to the polyelectrolyte multilayers through electro-less plating.

2. The integrated circuit chip package substrate of claim 1, wherein the polyelectrolyte multilayers comprise alternate depositions of oppositely charged weak polyelectrolytes.

3. The integrated circuit chip package substrate of claim 2, wherein the oppositely charged weak polyelectrolytes comprise polyacrylic acid (PAA) and polyallylamine hydrochloride (PAH).

4. The integrated circuit chip package substrate of claim 2, wherein the plurality of polyelectrolyte multilayers comprise about 25 layers.

5. The integrated circuit chip package substrate of claim 2, wherein the plurality of polyelectrolyte multilayers comprise a thickness of about 3 microns.

6. The integrated circuit chip package substrate of claim 2, wherein the plurality of polyelectrolyte multilayers comprise a top layer of PAA.

7. The integrated circuit chip package substrate of claim 1, wherein the plurality of polyelectrolyte multilayers comprise micropores with sizes of about 100 nm.

8. An apparatus comprising:
   an integrated circuit die; and
   a substrate, including a dielectric layer, a precursor layer on the dielectric layer, a plurality of weak polyelectrolyte multilayers on the precursor layer, and a copper plating layer adhered to the weak polyelectrolyte multilayers through electro-less plating, wherein the polyelectrolyte multilayers comprise alternate depositions of polyacids and polybases.

9. The apparatus of claim 8, wherein the alternate depositions of polyacids and polybases comprise polyacrylic acid (PAA) and polyallylamine hydrochloride (PAH).

10. The apparatus of claim 9, wherein the plurality of polyelectrolyte multilayers comprise about 25 layers.

11. The apparatus of claim 9, wherein the plurality of polyelectrolyte multilayers comprise micropores with sizes of about 100 nm.

12. An electronic appliance comprising:
a network controller;
a system memory; and
a processor, wherein the processor includes a substrate, including a dielectric layer, a precursor layer on the dielectric layer, a plurality of polyelectrolyte multilayers on the precursor layer, and a copper plating layer adhered to the polyelectrolyte multilayers through electro-less plating, wherein the plurality of polyelectrolyte multilayers comprise alternate depositions of polyacrylic acid (PAA) and polyallylamine hydrochloride (PAH).

13. The electronic appliance of claim 12, wherein the plurality of polyelectrolyte multilayers comprise a thickness of about 3 microns.

14. The electronic appliance of claim 12, wherein the plurality of polyelectrolyte multilayers comprise a top layer of PAA.

15. The electronic appliance of claim 12, wherein the plurality of polyelectrolyte multilayers comprise about 25 layers.

* * * * *

UNITED STATES PATENT AND TRADEMARK OFFICE
CERTIFICATE OF CORRECTION

PATENT NO. : 7,638,877 B2
APPLICATION NO. : 11/479101
DATED : December 29, 2009
INVENTOR(S) : Jomaa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 535 days.

Signed and Sealed this

Twenty-first Day of December, 2010

David J. Kappos
*Director of the United States Patent and Trademark Office*